United States Patent [19]
Lyford

[11] Patent Number: 5,834,935
[45] Date of Patent: Nov. 10, 1998

[54] HAND HELD INSTRUMENT WITH SAFETY LOCKED BATTERY COMPARTMENT

[75] Inventor: J. Steve Lyford, Portland, Oreg.

[73] Assignee: Tektronix, Inc., Wilsonville, Oreg.

[21] Appl. No.: 820,300

[22] Filed: Mar. 18, 1997

[51] Int. Cl.$^6$ .................................................. H02J 7/00
[52] U.S. Cl. ........................................................ 324/156
[58] Field of Search ............................. 73/431; 324/724, 324/156, 149; 361/1, 142, 667, 615–617; 439/136, 143–145, 911; 200/50.1, 50.21, 50.22, 50.28

[56] References Cited

U.S. PATENT DOCUMENTS

| | | |
|---|---|---|
| 4,492,831 | 1/1985 | Oakes . |
| 5,244,411 | 9/1993 | Schnke et al. .......................... 439/911 |

*Primary Examiner*—Robert Raevis
*Attorney, Agent, or Firm*—Boulden G. Griffith; Thomas F. Lenihan

[57] ABSTRACT

An electronic instrument with a housing having a battery compartment. The housing has a probe connector oriented on a probe axis, so that a probe may be connected to the instrument via the connector for interfacing with a device under test. A removable battery cover encloses the battery compartment, and has a probe aperture registered with the probe connector, so that a probe may be connected when the battery cover is installed. To prevent removal of the battery cover when a probe is connected to the probe connector, the battery cover is constrained against movement along the probe axis. In addition, the battery cover may contain a conductive safety element necessary to complete a circuit between the battery and other components in the instrument, so that the batteries are capable of delivering power only when the cover is properly installed.

19 Claims, 5 Drawing Sheets

HAND HELD INSTRUMENT WITH SAFETY LOCKED BATTERY COMPARTMENT

FIELD OF THE INVENTION

This invention relates to hand held electronic instruments, and more particularly to instruments having replaceable batteries and removable electrical leads.

BACKGROUND AND SUMMARY OF THE INVENTION

Hand held instruments such as digital multimeters (DMMs) are used for measuring electrical characteristics of various electronic devices. For portability, DMMs may have on-board power supplied by conventional replaceable batteries. To interface with devices under test, a set of removable probes is plugged into receptacles in the DMM, and is extended to contact electrical nodes on the device.

DMMs may be used for testing high voltage devices that may pose a safety hazard to a user. In particular, when the probes are connected to a high voltage device, circuitry in the DMM may also be "hot," or at a high voltage. For this reason, earlier DMMs have provided battery covers that resist removal when probes are connected. In one such apparatus, a flat battery cover overlays the probe receptacles, and has holes registered with the receptacles. Thus, the probes are normally removed before the lid is removed, preventing any exposed circuitry in the DMM from being at a high voltage potential when the batteries are replaced. Such configurations are limited in their effectiveness. They may be defeated when the probe diameter is smaller than the holes in the cover, permitting the cover to be lifted away from the DMM along the axis of the probes, so that the probe wires thread through the cover's holes, permitting access to the battery compartment. A hurried user having the probes attached to a complicated or delicate test set up may be tempted to employ this approach when battery replacement is required, instead of removing the probes from the DMM.

Another important disadvantage of such existing systems is that even if battery access is prevented without removal of the probes, the probes may readily be reinstalled without replacement of the battery cover. This may occur when the user forgets to reinstall the cover, when the cover is misplaced, or when the user wants to avoid removing the cover for subsequent battery replacements.

The above disadvantages are reduced or eliminated by providing an electronic instrument with a housing having a battery compartment. The housing has a probe connector oriented on a probe axis, so that a probe may be connected to the instrument via the connector for interfacing with a device under test. A removable battery cover encloses the battery compartment, and has a probe aperture registered with the probe connector, so that a probe may be connected when the battery cover is installed. To prevent removal of the battery cover when a probe is connected to the probe connector, the battery cover is constrained against movement along the probe axis. In addition, the battery cover may contain a conductive safety element necessary to complete a circuit between the battery and other components in the instrument, so that the batteries are capable of delivering power only when the cover is properly installed.

DETAILED DESCRIPTION OF A PREFERRED EMBODIMENT

Figure 1:
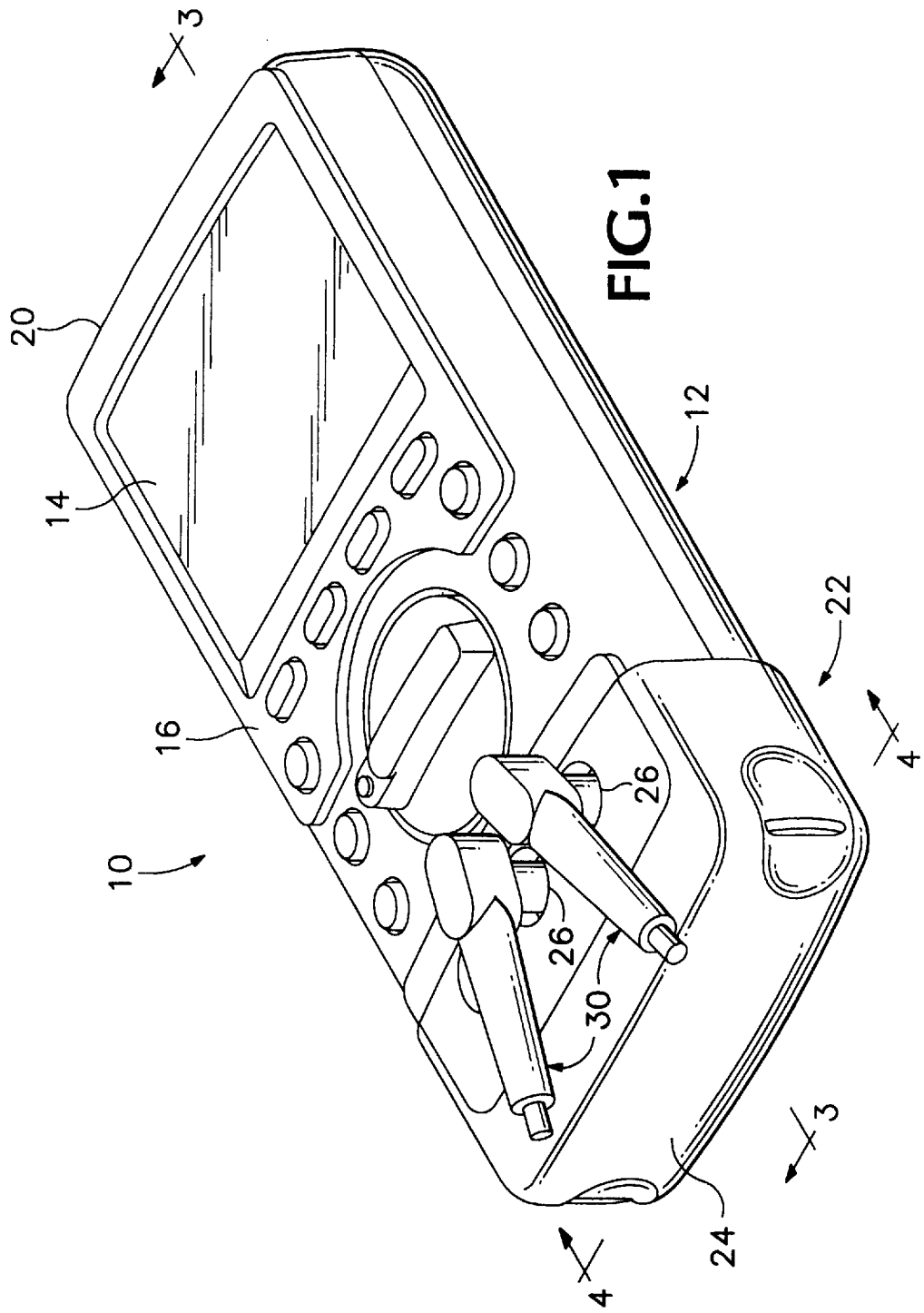
FIG. 1 is perspective view of an instrument according to a preferred embodiment of the invention.

FIG. 1 shows a hand held digital multi meter (DMM) 10 having a housing 12 with a display screen 14 on a front surface 16 of the housing near an upper end 20, and a box-shaped battery cover 22 encompassing a lower end 24 of the housing. The housing defines three probe connector apertures 26, each of which includes an electrical contact connected to internal instrument circuitry (not shown), and is configured for interfacing with a conventional electrical probe 30.

Figure 2:
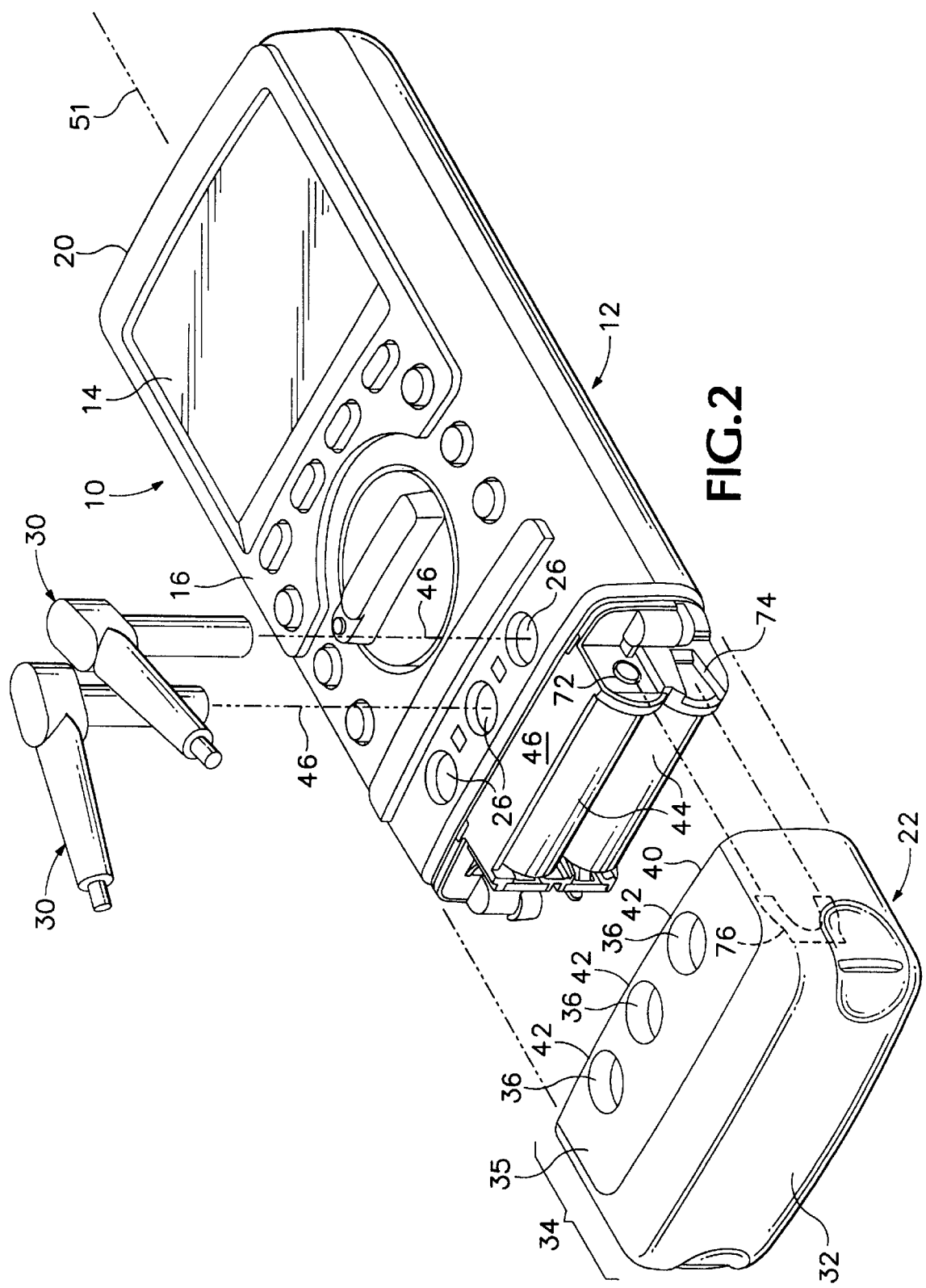
FIG. 2 is an exploded view of the instrument of FIG. 1 with the battery cover and probes removed.

As shown in FIG. 2, the battery cover 22 has the shape of an open ended box, with the open end facing and receiving the lower end 24 of the housing. The cover has a bottom panel 32 and a flange or sleeve portion 34 extending from the bottom panel. When installed on the housing as shown in FIG. 1, the sleeve portion encompasses a lower end of the housing. The sleeve portion includes a front panel 35 defining three probe holes 36 that register with the housing's connector apertures 26 when the cover is installed. Because the cover holes 36 are spaced apart from the rim 40 of the cover, a rigid web 42 of cover material will encounter a probe inserted deeply into the aperture 26, to prevent removal of the cover. A pair of batteries 44 are received in a battery receptacle 46 at the lower end 20 of the housing. Access for battery replacement is permitted only when the cover 22 is removed.

Figure 3:
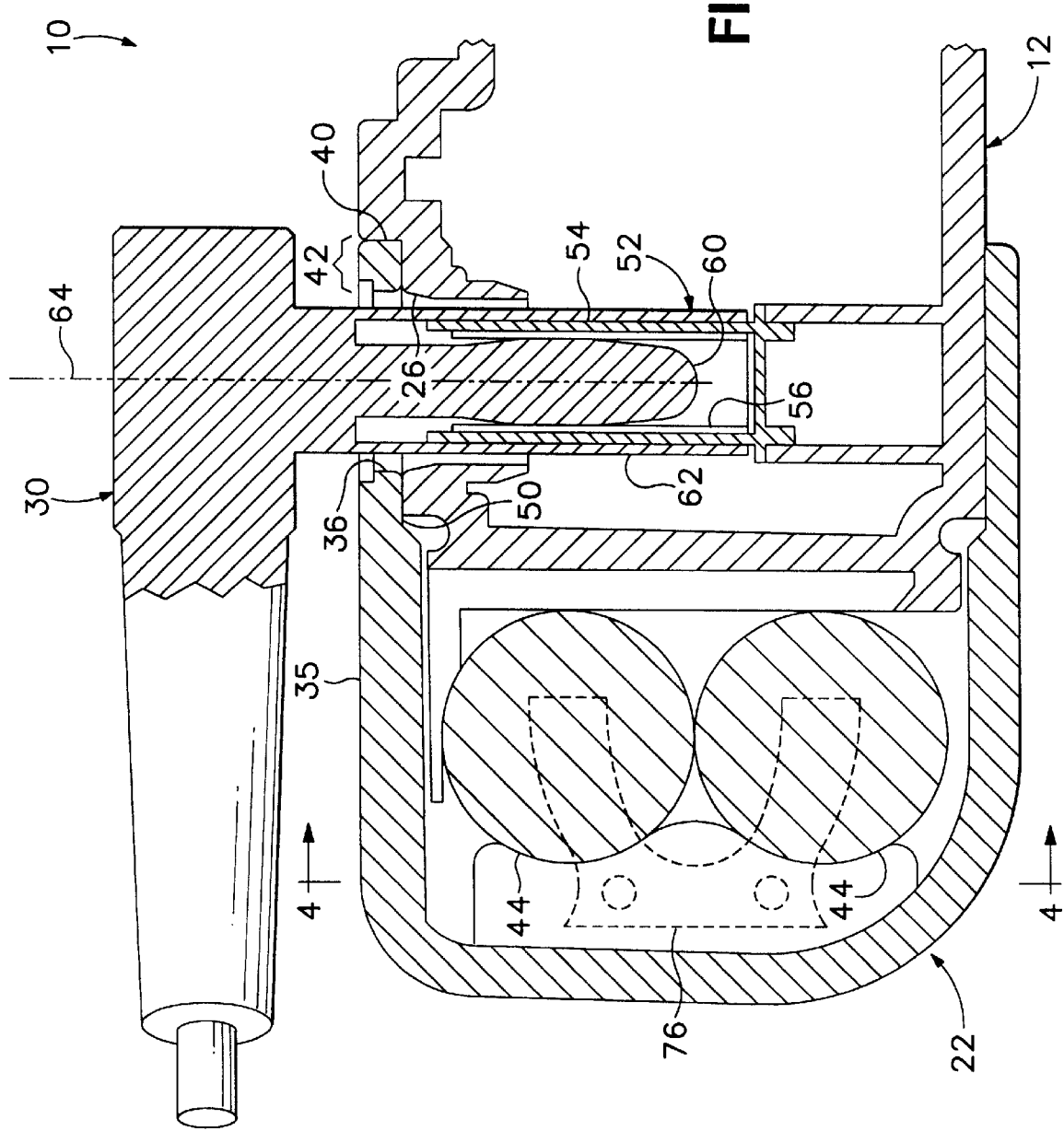
FIG. 3 is a sectional lateral view taken along line 3—3 of FIG. 1.

As shown in FIG. 3, the flange portion 34 of the battery cover 22 closely encompasses the lower end of the housing 12, so that an interior surface 50 of the front panel 35 is in direct sliding contact with a front surface of the housing. Thus, there is no gap between the web 42 and the housing as the cover is removed, so that even a thin or flexible probe wire would prevent removal of the cover. In the preferred embodiment, the close fit constrains the cover's relative motion to one degree of freedom: sliding along the long axis 51 of the instrument. Neither lateral translation nor rotation about any axis is permitted by the close fit.

A probe connector 52 is positioned within the hole 26, and includes an elongated cylindrical outer plastic sleeve 54 and a conductive inner sleeve 56. On the probe, an elongated conductive mandrel 60 makes ohmic contact with sleeve 56, and a protective plastic shield 62 extending longer than the mandrel encompasses the connector sleeve 54. The rigid body of the probe extends along a connector axis 64 coaxial with the connector, beyond the front surface of the housing and cover. This ensures that the cover is locked in place as long as the probe is installed. The connector axes are perpendicular to the long axis of the instrument.

Figure 4:
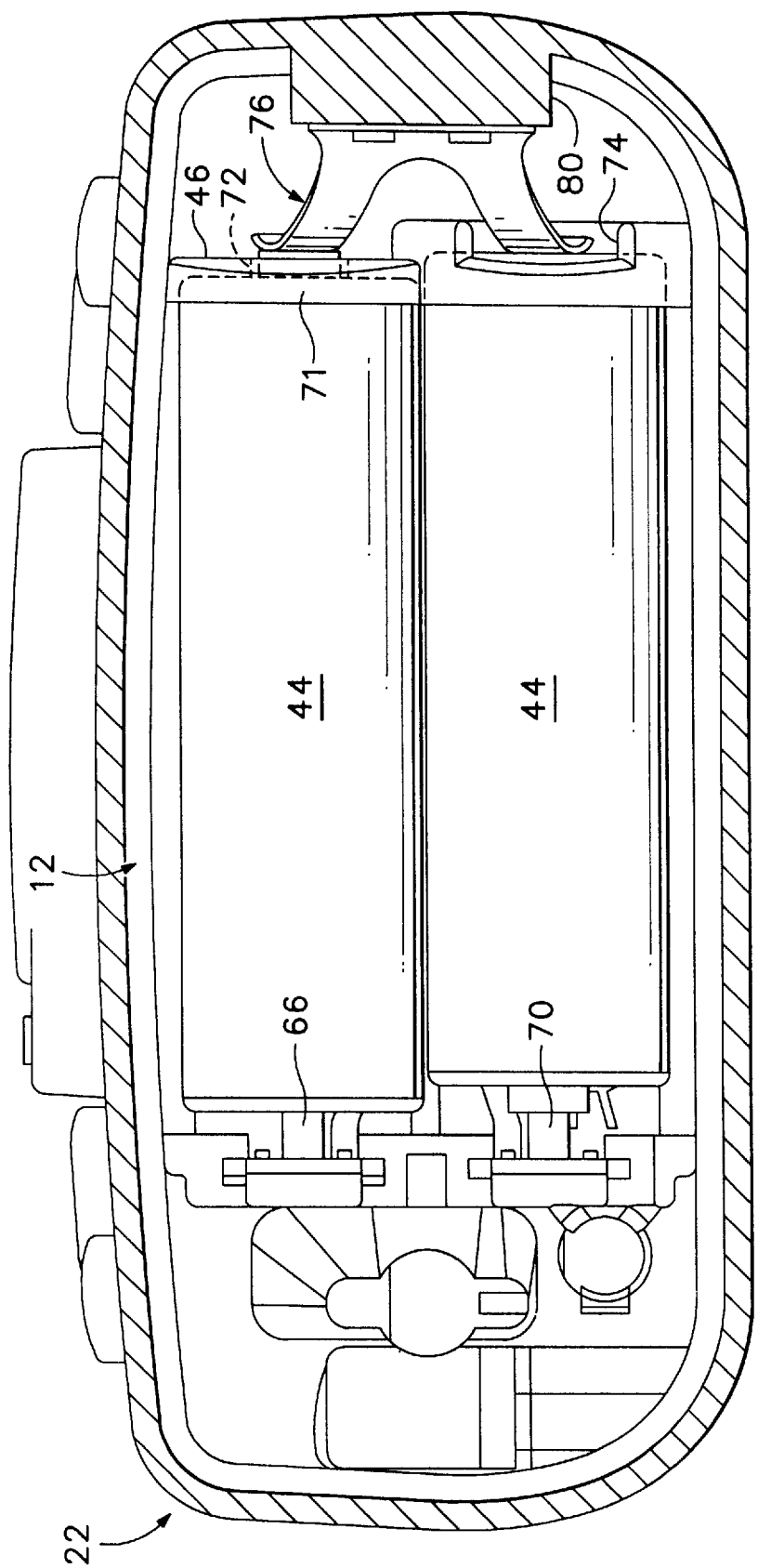
FIG. 4 is a sectional end view taken along line 4—4 of FIG. 1.

As shown in FIG. 4, the pair of conventional AA size batteries is contained within the receptacle 46 in side-by-side relation, with their positive terminals pointing in opposite directions. To provide power from the batteries to the instrument circuitry, a positive contact 66 and negative contact 70 are mounted to the housing to contact the adjacent end terminals of the respective batteries. The contacts are mounted side-by-side. At the opposite end of the batteries, a frame 71 restrains the battery ends, and provides openings for electrical connections. A circular hole 72 receives the positive terminal of the battery nearer the front surface, and a wider V-shaped opening 74 exposes the negative terminal of the other battery for electrical contact.

To provide a complete circuit with the batteries connected in series with each other, a conductive bridge 76 is mounted to the interior of the cover 22. The bridge is a metal leaf spring having two flexible arms, each contacting a terminal of a respective one of the batteries when the cover is installed on the housing. The hole 72 and opening 74 permit the arms to make direct electrical contact. The arms are curved away from the batteries at their free ends to present a smooth, convex surface, facilitating the repeated installation and removal of the cover, with the arms sliding freely across the housing and battery surfaces. The constrained axial motion of the cover relative to the housing is along an axis parallel to the long axis of the instrument and to the planar surfaces of contact between the bridge arms and the battery terminals. This gives a scrubbing contact as the cover is installed after battery replacement, ensuring a good contact. As shown, the bridge is mounted securely to a boss 80 in the interior of the cover. In an alternative embodiment, the conductive bridge may be mounted to the housing adjacent to but spaced apart from the battery terminals, with a non-conductive actuator element on the cover deflecting the bridge into contact with the batteries only when the cover is fully installed.

Figure 5:
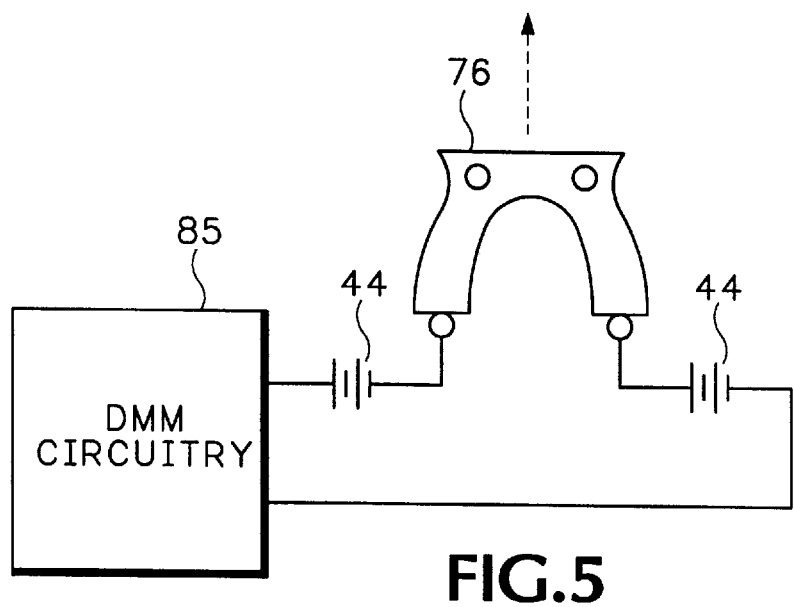
FIG. 5 shows, partly in schematic form and partly in pictorial form, the electrical circuit connection/disconnection feature of the invention.

FIG. 5 illustrates an electrical circuit employing safety device 76. DMM circuitry 85 is coupled in series with a pair of batteries 44 and safety device 76. As noted above safety device 76 is mounted to the interior of cover 22. When cover 22 is removed, safety device 76 moves in the direction of the dotted arrow, disconnects the batteries from the DMM circuitry, and thereby prevents operation of the DMM with the cover removed.

While the disclosure is made in terms of preferred and alternative embodiments, the invention is not intended to be so limited.

I claim:

1. An electronic instrument comprising:

a housing defining a battery compartment;

the housing defining a probe connector oriented on a probe axis for receiving a probe for interfacing with a device under test by the instrument;

a removable battery cover enclosing the battery compartment;

the battery cover defining a probe aperture registered with the probe connector, such that a probe may be connected to the probe connector when the battery cover is installed; and the battery cover being constrained against movement along the probe axis, such that the battery cover may not be removed when a probe is connected to the probe connector; and, wherein the cover includes a conductive safety element adjacent the battery compartment when the cover is installed.

2. The instrument of claim 1 wherein the battery cover is constrained to movement along a cover axis offset from the probe axis.

3. The instrument of claim 2 wherein the cover axis is perpendicular to the probe axis.

4. The instrument of claim 1 wherein the cover includes a sleeve portion closely receiving at least a portion of the housing, and wherein the probe aperture is defined in the sleeve portion.

5. The instrument of claim 1 wherein the probe connector defines an opening in an exterior surface portion of the housing occupying a surface plane, and wherein the cover is constrained for movement along a path parallel to the plane, such that the cover may not be removed when a probe is protruding from the probe connector.

6. The instrument of claim 1 wherein the cover is a sleeve having an open end for closely receiving an end of the housing.

7. The instrument of claim 1 including electronic circuitry in the housing connected to a set of battery contacts in the battery compartment via the safety element, such that battery power is disconnected when the cover is removed.

8. An electronic instrument comprising:

a housing defining a battery compartment;

the housing defining a probe connector oriented on a probe axis for receiving a probe for interfacing with a device under test by the instrument;

a removable battery cover enclosing the battery compartment;

the battery cover defining a probe aperture registered with the probe connector, such that a probe may be connected to the probe connector when the battery cover is installed; and the battery cover being constrained against movement along the probe axis, such that the battery cover may not be removed when a probe is connected to the probe connector; and, wherein the cover includes a conductive safety element adjacent the battery compartment when the cover is installed and wherein the safety element comprises a battery contact.

9. An electronic instrument comprising:

a housing defining a battery compartment;

the housing defining a probe connector for receiving a probe for interfacing with a device under test by the instrument;

a removable battery cover enclosing the battery compartment;

the battery cover defining a probe aperture registered with the probe connector, such that a probe may be connected to the probe connector when the battery cover is installed, and such that the battery cover may not be removed when a probe is connected to the probe connector; and wherein the cover includes a conductive safety element adjacent the battery compartment when the cover is installed, such that the instrument is inoperable when the cover is removed.

10. The instrument of claim 9 including electronic circuitry in the housing connected to a set of battery contacts in the battery compartment via the safety element, such that battery power is disconnected when the cover is removed.

11. The instrument of claim 9 wherein the safety element comprises a battery contact.

12. An electronic instrument comprising:

a housing defining a battery compartment;

the housing defining a probe connector for receiving a probe for interfacing with a device under test by the instrument;

a removable battery cover enclosing the battery compartment;

the battery cover defining a probe aperture registered with the probe connector, such that a probe may be connected to the probe connector when the battery cover is installed, and such that the battery cover may not be removed when a probe is connected to the probe connector; and wherein the cover includes a conductive safety element adjacent the battery compartment when the cover is installed such that the instrument is inoperable when the cover is removed; and wherein the battery compartment defines a battery receptacle, and wherein a portion of the safety element is positioned within the receptacle such that it contacts a pole of a battery installed in the receptacle.

13. An electronic instrument comprising:

a housing defining a battery compartment;

the housing defining a probe connector for receiving a probe for interfacing with a device under test by the instrument;

a removable battery cover enclosing the battery compartment;

the battery cover defining a probe aperture registered with the probe connector, such that a probe may be connected to the probe connector when the battery cover is installed; and probe interlock means preventing removal of the battery cover when the probe is installed.

14. The instrument of claim 13 wherein the interlock means comprises means for preventing removal of the battery cover in a direction perpendicular to a housing surface portion in which the probe connector is defined.

15. The instrument of claim 13 wherein the probe connector defines a bore on a probe axis, and wherein the interlock means comprises means for constraining the battery cover to move in a direction offset from the probe axis.

16. The instrument of claim 15 wherein the interlock means comprises means for constraining the battery cover to move in a direction perpendicular to the probe axis.

17. The instrument of claim 15 wherein the interlock means comprises means for sliding a portion of the battery cover across a housing surface portion adjacent to the probe connector to the housing directly over the probe connector.

18. An electronic instrument comprising:

a housing defining a battery compartment;

the housing defining a probe connector, such that a probe may be connected to the instrument via the connector for interfacing with a device under test by the instrument;

a removable battery cover enclosing the battery compartment;

the battery cover defining a probe aperture registered with the probe connector, such that a probe may be connected to the probe connector when the battery cover is installed; and probe interlock means preventing removal of the battery cover when the probe is installed; said instrument including power disconnect means for disabling delivery of power to the instrument when the battery cover is removed.

19. The instrument of claim 18 wherein the disconnect means comprises a conductive element on the battery cover.

* * * * *